(12) United States Patent
Sakurai

(10) Patent No.: US 6,425,484 B1
(45) Date of Patent: Jul. 30, 2002

(54) TAPE-SHAPED PARTS PACKAGE, PARTS STORING TAPE, TAPE-SHAPED COVER AND PARTS PACKAGING APPARATUS

(75) Inventor: Teruyasu Sakurai, Saitama (JP)

(73) Assignee: Yayoi Corporation, Tokyo (JP)

( * ) Notice: Subject to any disclaimer, the term of this patent is extended or adjusted under 35 U.S.C. 154(b) by 0 days.

(21) Appl. No.: 09/632,965

(22) Filed: Aug. 4, 2000

Related U.S. Application Data

(62) Division of application No. 09/297,853, filed as application No. PCT/JP98/04045 on Sep. 9, 1998.

(30) Foreign Application Priority Data

Sep. 10, 1997 (JP) .............................................. 9-245162
Oct. 3, 1997 (JP) .............................................. 9-270888

(51) Int. Cl.$^7$ ............................................ B65D 85/00
(52) U.S. Cl. ...................................... 206/714; 206/713
(58) Field of Search ................................ 206/713, 714, 206/725, 330, 331

(56) References Cited

U.S. PATENT DOCUMENTS

| | | | | |
|---|---|---|---|---|
| 5,152,393 A | * | 10/1992 | Chenoweth | 206/330 |
| 5,234,104 A | * | 8/1993 | Shulte et al. | 206/330 |
| 5,361,901 A | * | 11/1994 | Schenz et al. | 206/332 |
| 5,964,353 A | * | 10/1999 | Hamlin | 206/714 |
| 6,179,127 B1 | * | 1/2001 | Kato et al. | 206/714 |

FOREIGN PATENT DOCUMENTS

| | | |
|---|---|---|
| JP | 4-1171 | 1/1992 |
| JP | 9-183485 | 7/1995 |

* cited by examiner

Primary Examiner—David T. Fidei
(74) Attorney, Agent, or Firm—Frommer Lawrence & Haug LLP; William S. Frommer; Matthew K. Ryan

(57) ABSTRACT

In a parts storing tape, a first stepped part which has the predetermined height and is more extended than the other inner side faces of a recessed part in the width direction and the longitudinal direction of the above parts storing tape is provided at each corner part of the recessed part. Thereby, even if the corner part of a storing part is more projecting outside than the other peripheral part, the above storing part can be supported without that its corner parts contact or stick in the inner side faces of the parts storing tape by each of the first stepped parts. At the same time, in a tape-shaped parts package, a tape-shaped cover and a parts packaging apparatus, projecting parts which have resilience and are elastic in the direction of thickness of the above tape-shaped cover are provided or can be provided respectively corresponding to each recessed part of the parts storing tape on the surface opposite to the parts storing tape of the tape-shaped cover. Thereby, storing parts stored in the recessed part of the parts storing tape can be always energized to the direction pushing into the corresponding recessed part of the parts storing tape by the projecting part of the tape-shaped cover.

4 Claims, 11 Drawing Sheets

A

B

TAPE-SHAPED PARTS PACKAGE, PARTS STORING TAPE, TAPE-SHAPED COVER AND PARTS PACKAGING APPARATUS

This is a divisional of application Ser. No. 09/297,853, filed May 6, 1999, which is a 371 of PCT/JP98/04045, filed Sep. 9, 1998.

FIELD OF THE ART

The present invention relates to a tape-shaped parts package, a parts storing tape, a tape-shaped cover and a parts packaging apparatus, and is suitably applied to a tape-shaped parts package, a parts storing tape, a tape-shaped cover and a parts packaging apparatus used for carrying semiconductor tips, for example.

BACKGROUND ART

Heretofore, as this kind of tape-shaped parts package, there is a one structured as FIG. 1. This tape-shaped parts package 1 is composed of a carrier tape 2 which has flexibility and is made of resin material, and a cover tape 3 which has elasticity and is made of resin material.

In this case, on one side of the carrier tape 2, recessed parts 2A for storing semiconductor tips (hereinafter, this is referred to as embossed parts) are formed sequentially along the longitudinal direction at fixed spaces, and also feed holes 2B are sequentially formed at one side of the width direction at a specified pitch, corresponding to each of the embossed parts 2A respectively.

The cover tape 3 is stuck on the one side of the carrier tape 2 along its longitudinal direction to cover each of the embossed parts 2A.

Thereby, in this tape-shaped parts package 1, a semiconductor tip stored in each embossed part of the carrier tape 2 can be held in a predetermined state by the inner side faces of the embossed parts 2A of the above carrier tape 2 and the cover tape 3.

By the way, semiconductor tips are normally made in a process of forming a plurality of the same circuit patterns on one side of an wafer made of ceramic or silicon or the like, using a method such as a photolisography, notching the wafer, enlarging this by an expand method, and cutting each circuit pattern individually.

Therefore, semiconductor tips are various in shape and size by the shape of crack even if they have been separated from the same wafer. For example, as shown in FIG. 2, there is a case where protruding parts 5A to 5C more projecting outside than the other peripheral parts are formed at the corners of a semiconductor tip 5.

Then, if trying to store such semiconductor tip 5 in the aforementioned tape-shaped parts package 1, problems occur that it cannot be stored in the predetermined state because the corner parts (i.e., protruding parts 5A to 5C) contact the inner side faces of the embossed part 2A of the carrier tape 2, or it cannot be easily taken out because the above corner parts stick in the inner side faces of the embossed part 2A.

Besides, in the aforementioned tape-shaped parts package 1, the cover tape 3 is normally stuck on one side of the carrier tape 2 at the both ends in the width direction by bonding or press-contacting by heat. Thus, if the carrier tape 2 bends in the width direction, the cover tape 3 also bends accompanying with this; so that there is a case where the semiconductor tip 5 stored in the embossed part 2A of the carrier tape 2 is protruded from the embossed part 2A and unfortunately fits into between the one side of the carrier tape 2 and the cover tape 3.

And in this case, for example, if this tape-shaped parts package 1 is set in an equipment such as an electronic parts mounting device as electronic parts supplier, there is a problem that such inconvenience occurs that an electronic parts take-out mechanism part cannot pick up the semiconductor tip protruded from the embossed part 2A of the carrier tape 2 in a specified state.

The present invention has been done considering the above points, and is proposing a parts storing tape capable of storing parts different in the manufacturing accuracy without any inconvenience, and a tape-shaped parts package, a tape-shaped cover and a parts packaging apparatus that can prevent storing parts from needless protruding from the recessed parts of a parts storing tape.

DISCLOSURE OF INVENTION

According to the present invention, in a tape-shaped parts package having a parts storing tape in which a plurality of recessed parts in a specified shape corresponding to storing parts are formed on one side and a tape-shaped cover stuck on the above one side of the parts storing tape so as to cover each recessed part of the parts storing tape, projecting parts elastically flexible in the direction of the thickness of the above tape-shaped cover on the surface opposite to the parts storing tape of the tape-shaped cover are provided corresponding to each recessed part of the parts storing tape respectively. Thereby, the stored parts in the recessed parts of the parts storing tape can always be energized to the direction pushing into the corresponding recessed part of the parts storing tape by the projecting parts of the tape-shaped cover.

According to the present invention, in a parts storing tape in which a plurality of recessed parts in a specified shape corresponding to storing parts are formed on one side, a first stepped part which is respectively provided at each corner of the recessed part, more extended than the other inner side faces of the recessed part in the width direction and longitudinal direction of the above parts storing tape, and have a specified height, are provided. Thereby, even if the corner part of the parts in the recessed part is slightly more projecting outside than the other peripheral parts, the above parts can be supported in a specified state by each first stepped part.

According to the present invention, in a tape-shaped cover to be stuck on one side of the above parts storing tape on which a plurality of recessed parts in a specified shape corresponding to storing parts are formed so as to cover each recessed part of the parts storing tape, projecting parts elastically flexible in the direction of the thickness of the above tape-shaped cover are provided on the surface opposite to the parts storing tape, respectively corresponding to each recessed part of the parts storing tape. Thereby, the stored parts in the recessed parts of the parts storing tape can always be energized to the direction pushing into the corresponding recessed part of the parts storing tape by the projecting parts of the tape-shaped cover.

Moreover, according to the present invention, in a parts packaging apparatus for sticking a tape-shaped cover on one side of a parts storing tape on which a plurality of recessed parts in a specified shape have been formed so as to cover each recessed part, a projecting part forming means for forming projecting parts elastically flexible in the direction of the thickness of the above tape-shaped cover on the surface opposite to the parts storing tape of the tape-shaped cover respectively corresponding to each recessed part of the parts storing tape, and a sticking means for sticking the tape-shaped cover with the projecting parts on the one side of the parts storing tape are provided. Thereby, in a tape-shaped parts package formed by this parts packaging apparatus, stored parts in the recessed parts of the parts storing tape can always be energized to the direction pushing into the corresponding recessed part of the parts storing tape by the projecting part of the tape-shaped cover.

BEST MODE FOR CARRYING OUT THE INVENTION

Embodiments of the present invention will be described in detail with reference to the accompanying drawings.

(1) Structure of Tape-Shaped Parts Package According to This Invention

Figure 1:
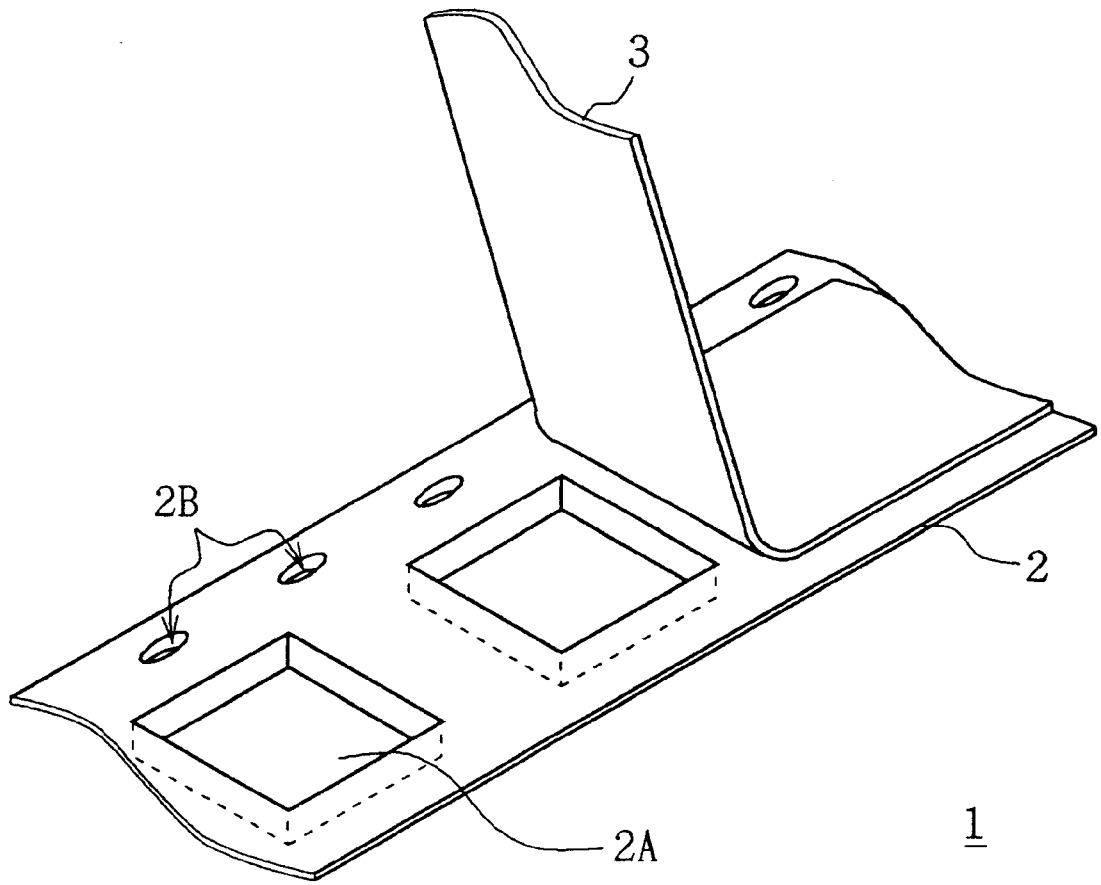
FIG. 1 is a perspective view showing the structure of a conventional tape-shaped parts package.
Figure 2:
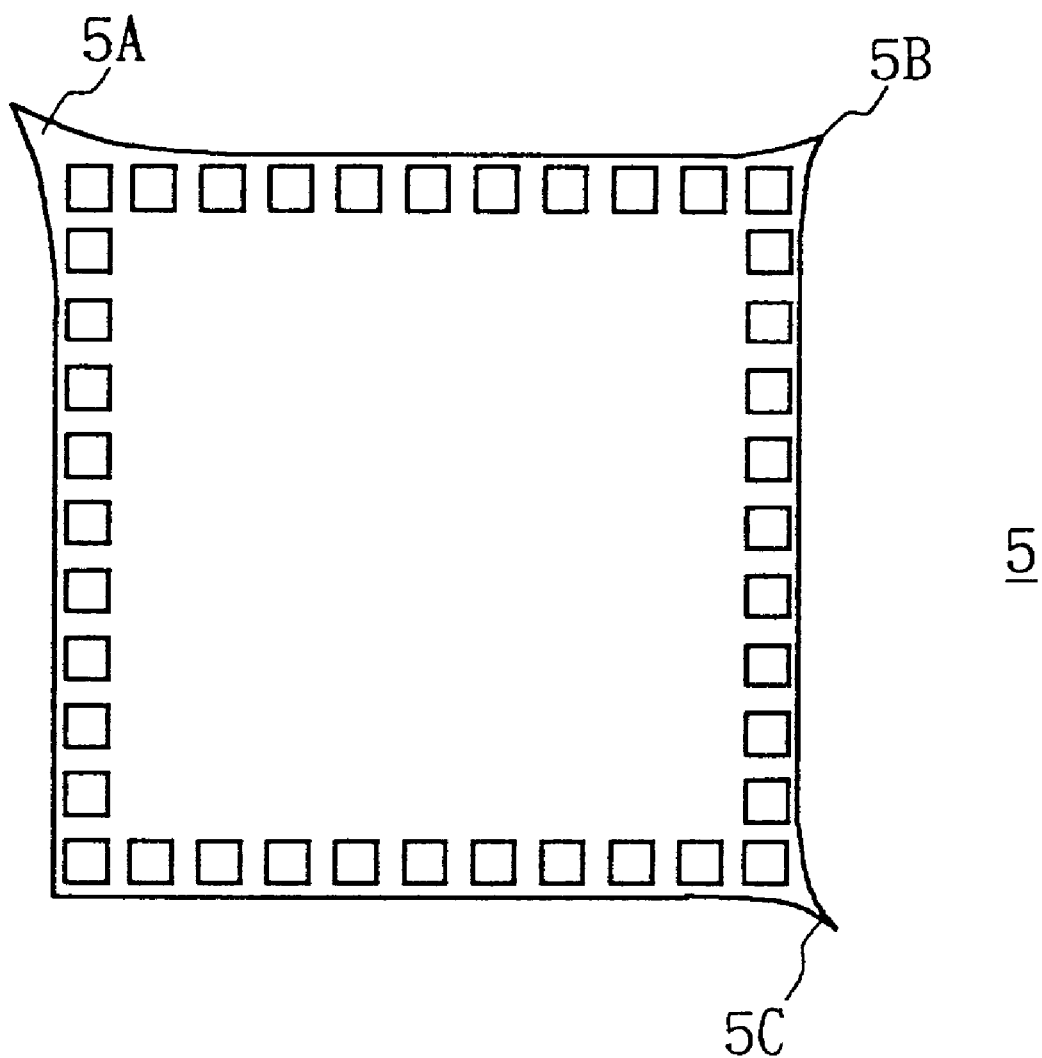
FIG. 2 is a bottom view explaining a projecting part formed on a semiconductor tip.
Figure 3:
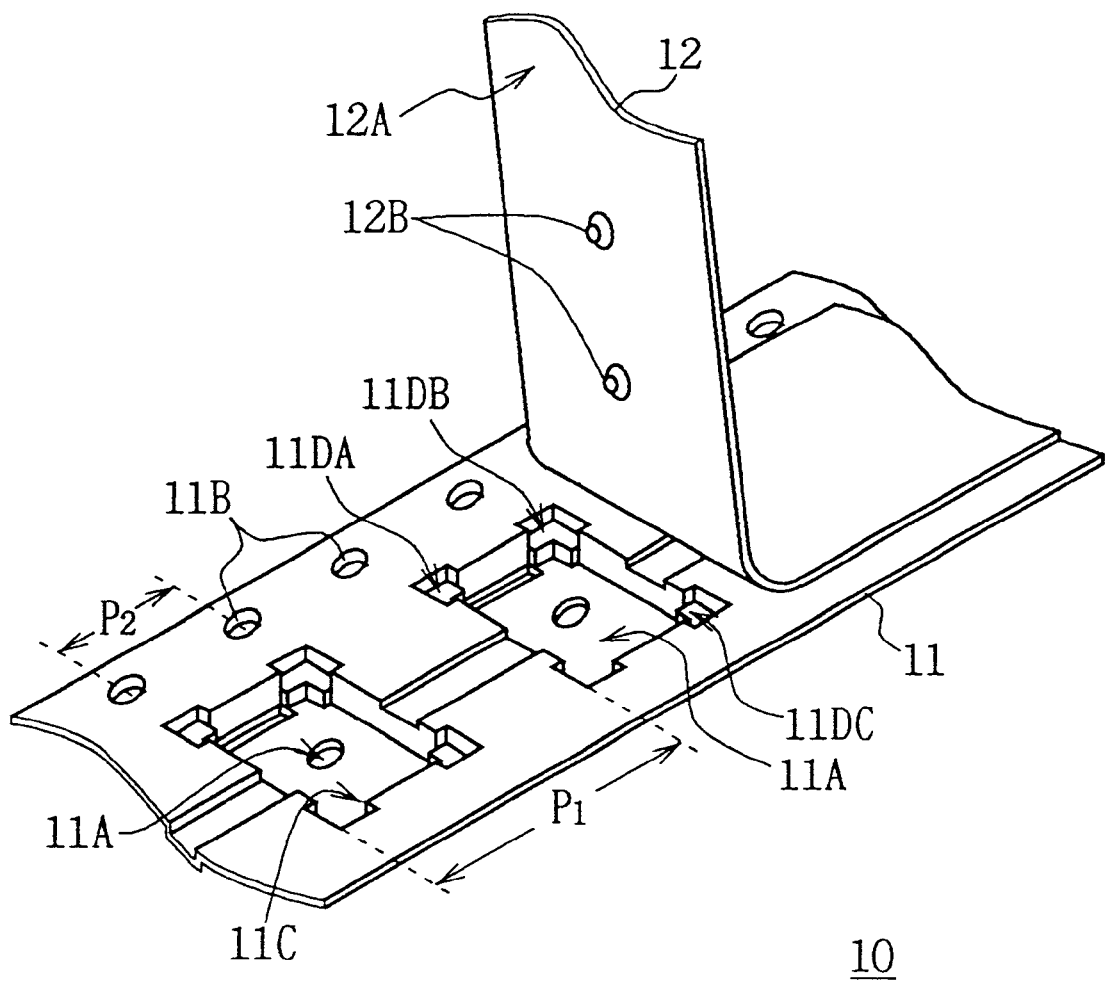
FIG. 3 is a schematic perspective view showing the structure of a tape-shaped parts package according to the present invention.

Referring to FIG. 3, 10 generally shows a tape-shaped parts package. This is composed of a carrier tape 11 made of flexible resin material and a cover tape 12 which has a flexible resin film of such as polyethylene formed using a biaxial stretch method, for example, as a base.

In the carrier tape 11, as shown in FIG. 3 and FIGS. 4A to 4C, embossed parts 11A for storing one semiconductor tip at the almost center in the width direction are sequentially formed at a specified first pitch P1, and at the same time, feed holes 11B are sequentially formed at one side in the width direction at a specified second pitch P2, along its longitudinal direction (an arrow (a)).

Furthermore, at the center of the bottom face 11B of each embossed part 11A, for example, a circular first damage-proof recessed part 11BX is formed deeper than the above bottom face 11B, and at the both ends of the bottom face 11B of the embossed part 11A in the longitudinal direction, for example, rectangular second damage-proof recessed parts 11BY are formed in the same depth as the first damage-proof recessed part 11BX, respectively.

Thereby, in this carrier tape 11, force from the depth direction (an arrow (c)) applied to each embossed part 11A can be absorbed into the first damage-proof recessed parts 11BX, and force from the width direction (an arrow (b)) can be absorbed into the second damage-proof recessed parts 11BY. Thus, damage to semiconductor tips stored in the embossed parts 11 owing to these force can be prevented.

Moreover, at the four corners of each embossed part 11A, stepped parts 11DA to 11DD having a specified height respectively each which is more extended than the other inner side faces by specified lengths W1 and W2 respectively in the width direction and longitudinal direction of the carrier tape 11, are provided.

Thereby, in this carrier tape 11, the semiconductor tips stored in the embossed parts 11A can be held in a specified state by supporting their four corners by the respective stepped parts 11DA to 11DD. On the other hand, even if the corner part of the above semiconductor tip is more projected outside than the other peripheral parts at this time, it can be prevented that the corner of the above semiconductor tip contacts or sticks in the inner side face of the embossed part 11A.

Besides, as it is obvious from FIG. 3, in the cover tape 12, projecting parts 12B are sequentially provided along the longitudinal direction of the above cover tape 12 corresponding to each embossed part 11A of the carrier tape 11 respectively, that are formed by deforming the above cover tape 12 so that it positions at the center of the end of the opening of the corresponding embossed part 11A and projects on the side of the surface 12A opposite to the carrier tape 11 (hereinafter, this surface is referred to as the bottom face of the cover tape).

Figure 5:
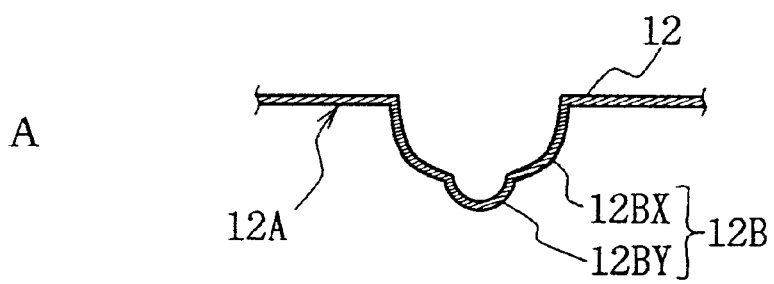
FIG. 5A is a cross section showing the structure of the projecting part of a cover tape according to the present invention.
FIG. 5B is a cross section explaining the motion of the projecting part.
Figure 5:
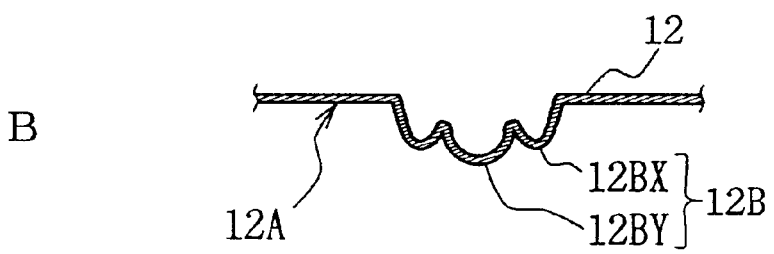

In this embodiment, as shown in FIG. 5A, each projecting part 12B is composed of a first projecting part 12BX being a part of a spherical shell and a second projecting part 12BY provided at the tip of the first projecting part 12BX and being a part of a spherical shell having a smaller diameter than the above first projecting part 12BX which is.

Thereby, when force is applied from the bottom face 12A of the cover tape 12 to the second projecting part 12BY, the first projecting part 12BX (and the second projecting part 12BY) are deformed and the projecting part 12B gets into the above first projecting part 12BX as shown in FIG. 5B. On the contrary, when this force is removed, the first and the second projecting parts 12BX and 12BY are returned to the original state as shown in FIG. 5A, so that it can elastically be flexible as a whole in the height direction (i.e., the direction of the thickness of the cover tape 12).

Moreover, the height of each projecting part 12B is selected so that when the cover tape 12 is stuck on the carrier tape 11, it becomes longer than the distance from the bottom face 12A of the above cover tape 12 to the top of a semiconductor tip stored in the embossed part 11A of the carrier tape 11.

Figure 6:
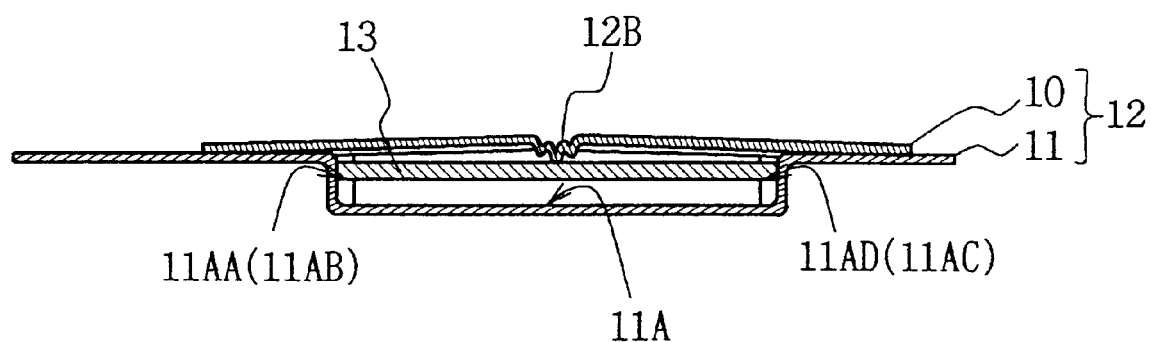
FIG. 6 is a schematic cross section showing the state where a semiconductor tip has been stored in the tape-shaped parts package according to the present invention.

Thereby, in this tape-shaped parts package 10, as shown in FIG. 6, when a semiconductor tip 13 is stored in the embossed part 11A of the carrier tape 11 and then the cover tape 12 is stuck on the above carrier tape 11, the semiconductor tip 13 is energized to the direction pushing into the embossed part 11A of the carrier tape 11 in the state where each projecting part 12B is elastically shriveling by force applied from the semiconductor tip to each projecting part 12B of the cover tape 12 as the reaction of the tension of the above cover tape 12. On the contrary, also when the carrier tape 11 has bent from this state and the cover tape 12 is bending accompanying with this, the projecting part 12B of the cover tape 12 lengthens corresponding to that. Thereby, the state where the semiconductor tip 13 is energized to the direction pushing into the corresponding embossed part 11A of the carrier tape 11 by the above projecting part 12B can be maintained.

(2) Structure of Parts Packaging Apparatus

Figure 7:
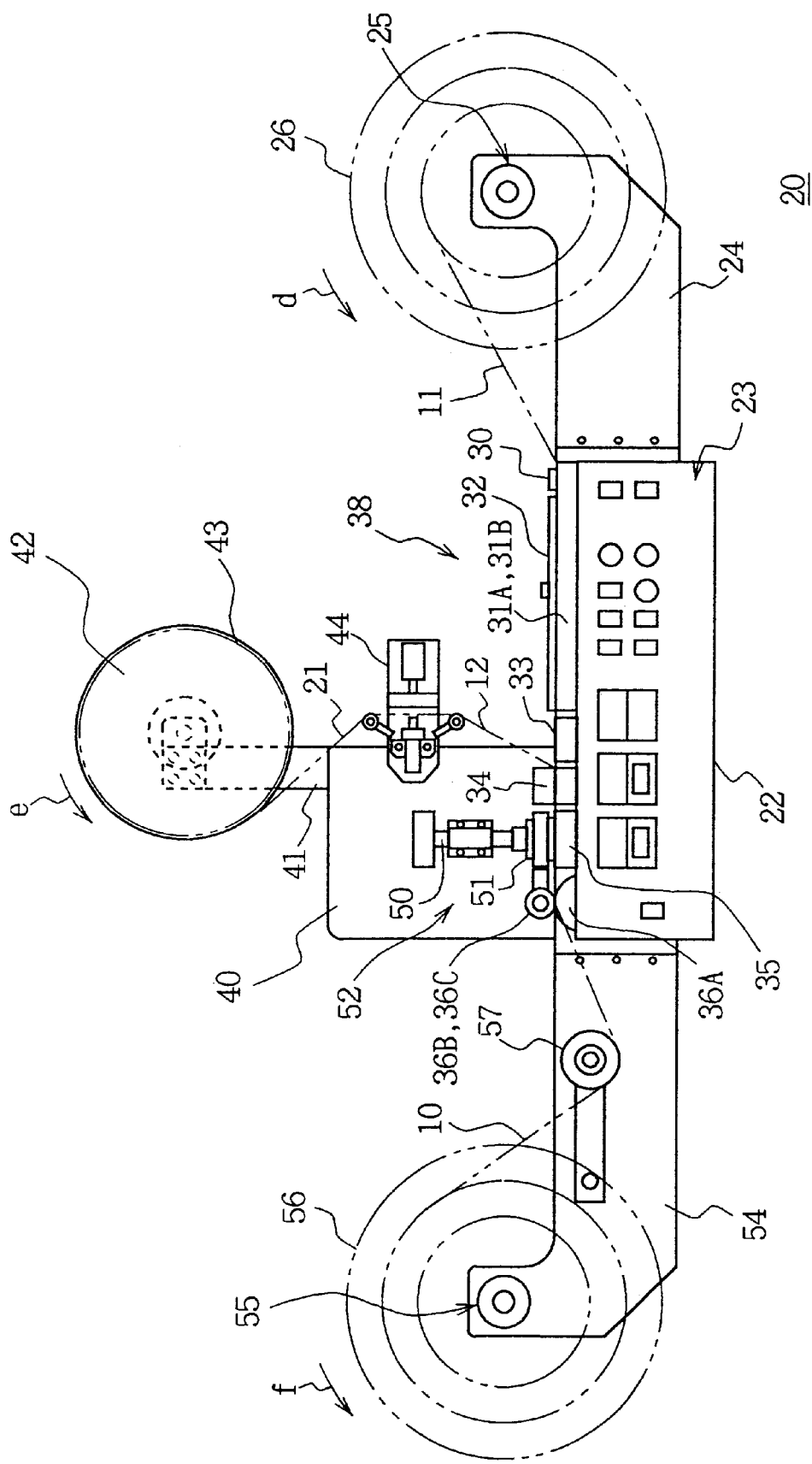
FIG. 7 is a schematic side view illustrating the structure of a parts packaging apparatus according to the present invention.
Figure 8:
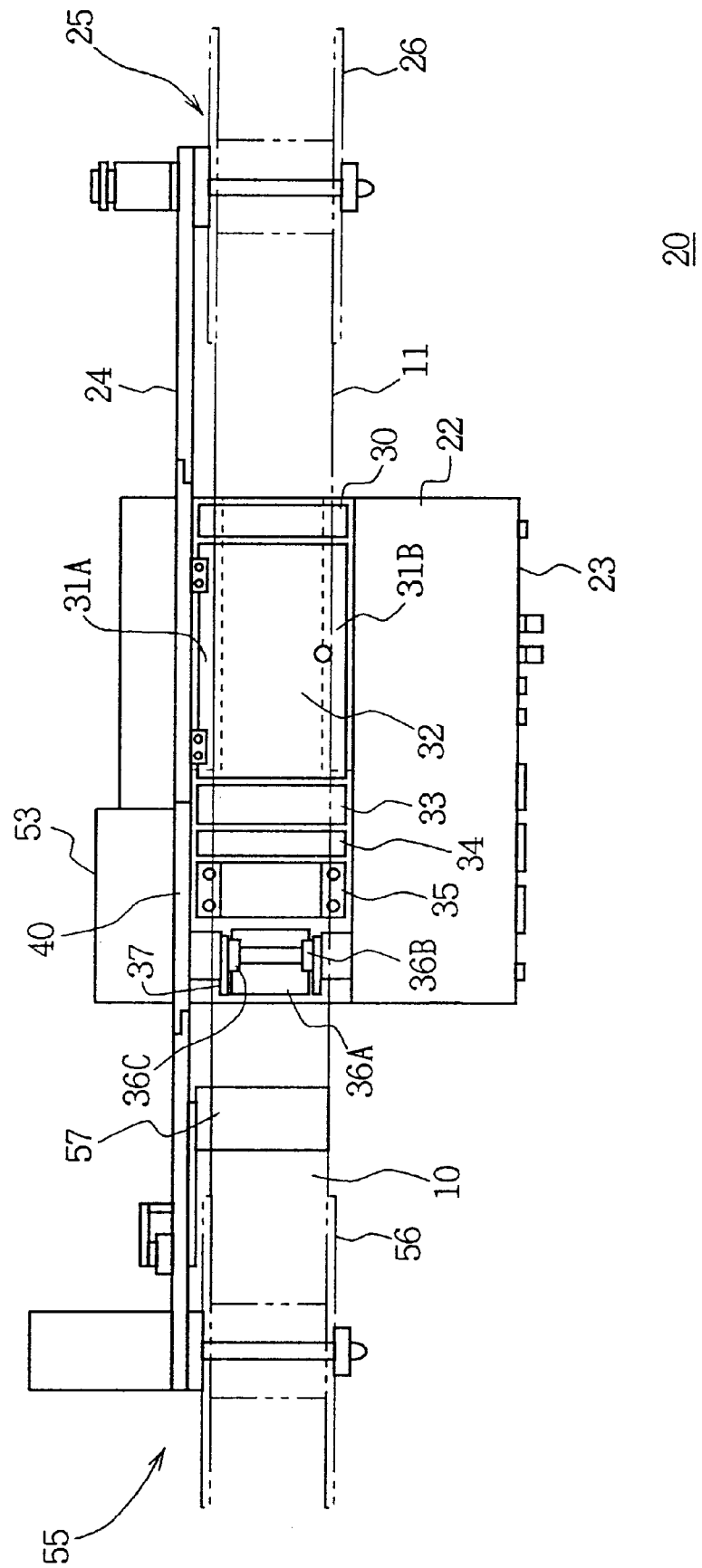
FIG. 8 is a schematic plane view illustrating the structure of the parts packaging apparatus according to the present invention.

FIGS. 7 and 8 illustrate a parts packaging apparatus which sequentially forms the above projecting part 12B on a flat cover tape 21 and can sequentially stick this on the upper surface of the carrier tape 11 in which the semiconductor tip 13 has been stored in the embossed part 11A.

An operating panel is disposed at the front of the main body part 22 of this parts packaging apparatus 20, and a control part (not shown in figure) for managing the control of the whole apparatus is stored inside the above main body part 22.

Moreover, a carrier tape reel holding part 25 is disposed on the right side of this main body part 22 in FIGS. 7 and 8 via an arm 24, and a reel 26 on which the carrier tape 11 is wound (hereinafter, this is referred to as carrier reel) can be held freely rotatably in the direction of an arrow (d) by this carrier tape reel holding part 25.

In the main body part 22, a tape running driving part 38 which is composed of a carrier tape guide 30, a pair of guide rails 31A and 31B, a tape cover 32, a lifting detecting board 33, a cover tape guide 34, a seal lower die 35, lifting-proof rollers 36A to 36C and a sprocket 37 engaged with the feed holes 11B of the carrier tape 11, is provided corresponding to the position of the carrier tape reel 26 held by the carrier tape reel holding part 25. This parts packaging apparatus 20 can intermittently run the carrier tape 11 pulled out from the carrier tape reel 26 at the aforementioned first pitch P1 while guiding its running position by the carrier tape guide 30 and the guide rails 31A and 31B, etc., based on rotating force applied from a drive source not shown in figure, to the sprocket 37.

Moreover, a parts storing part not shown in figure is disposed near the lifting detecting board 33 of the main body part 22. The semiconductor tip 13 fed to the position of the lifting detecting board 33 can be stored one by one in the embossed part 11A of the carrier tape 11 by this parts storing part.

On the other hand, a cover tape reel holding part 42 is disposed above the main body part 22 sequentially via a unit mounting board 40 and a support 41. A reel 43 on which the cover tape 21 is wound (hereinafter, this is referred to as cover tape reel) can be held freely rotatably in the direction of an arrow (e) by this cover tape reel holding part 42.

A cover tape working part 44 is fixed to the unit mounting board 40. The above projecting part 12B can be sequentially formed on the cover tape 21 pulled out from the cover tape reel 43 by this cover tape working part 44.

For this working, the mounting position of the cover tape working part 44 to the unit mounting board 40 is selected so that each projecting part 12B sequentially formed on the cover tape 21 by the above cover tape working part 44 is positioned at the center of the end of the opening of the corresponding embossed part 11A of the carrier tape 11, respectively.

The cover tape 12 obtained by forming the projecting part 12B at the specified position of the cover tape 21 by this cover tape working part 44 is then stacked on one side of the carrier tape 11 in the specified state via the cover tape guide 34 of the tape running driving part 38, and sent on the seal lower die 35.

A seal unit part 52 having a shaft 50 provided freely in the vertical direction, and a seal iron 51 fixed at the bottom of the above shaft 50 to be opposite to the seal lower die 35 in which a heater is provided, is disposed above the seal lower die 35.

The seal iron 51 goes down at a timing that the intermittently-fed carrier tape 11 stops running based on driving force applied from a drive source 53 disposed at the rear side of the unit mounting board 40 (FIG. 8) to the shaft 50, and applies heat and pressure on the cover tape 12 stacked on the carrier tape 11. On the other hand, this goes up at a timing that the carrier tape 11 starts running, and can perform thermo compression bonding on the cover tape 12 onto the carrier tape 11.

The tape-shaped parts package 10 formed in this manner in which the semiconductor tips 13 have been stored is discharged on the left side of the main body 22 in FIGS. 7 and 8 via the lifting-proof rollers 36A to 36C of the tape running driving part 38 thereafter.

On the left side of the main body part 22, a take-up reel holding part 55 is provided via an arm 54. This take-up reel holding part 55 can hold a take-up reel 56 freely in rotary driving in the direction of an arrow (f). Thereby, the tape-shaped parts package 10 discharged from the lifting-proof roller 36A to 36C and supplied via a tension roller 57 can be sequentially taken up by the take-up reel 56.

(3) Structure of Cover Tape Working Part

Figure 9:
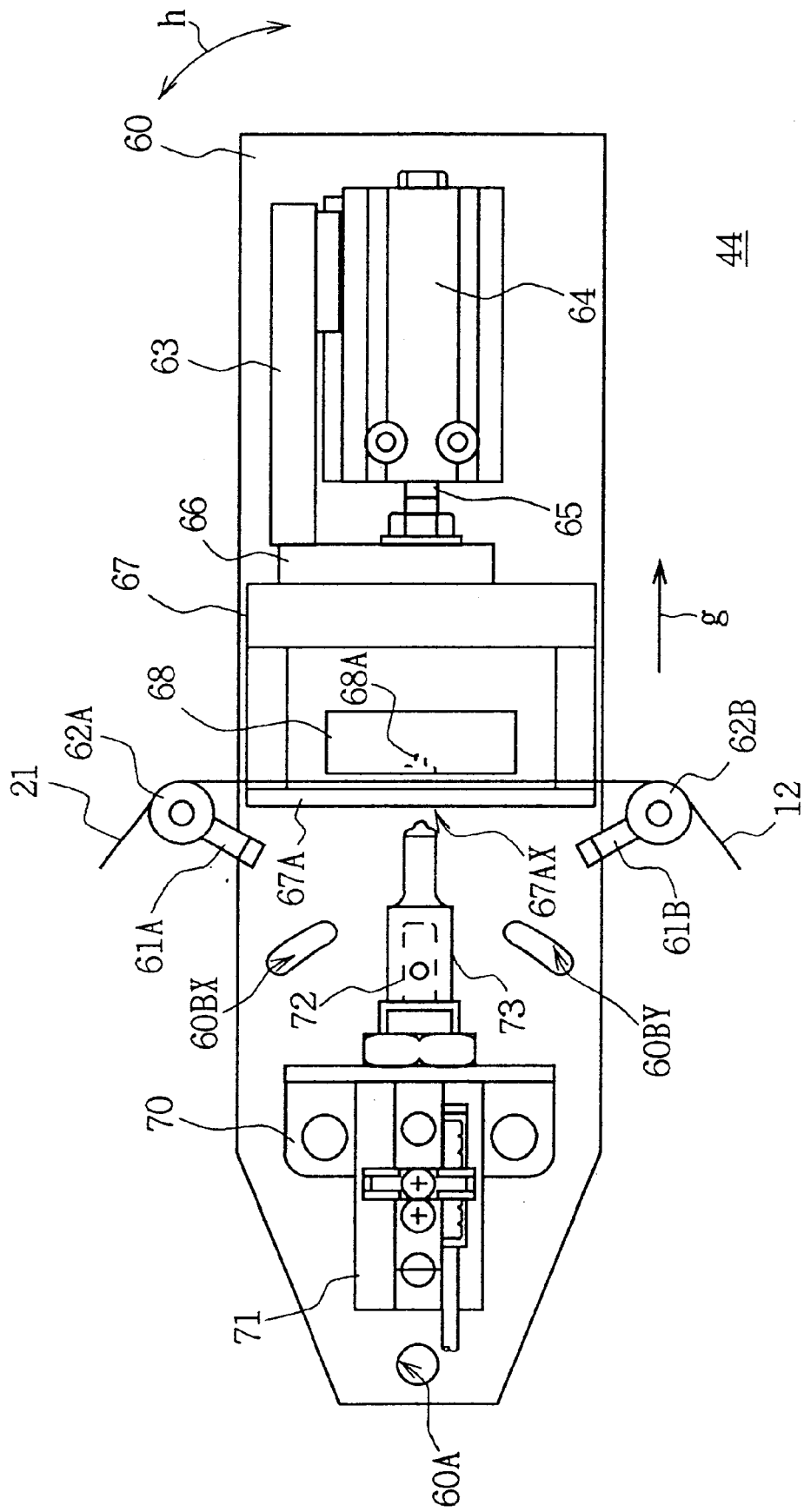
FIG. 9 is a plane view showing the structure of a cover tape working part.
Figure 10:
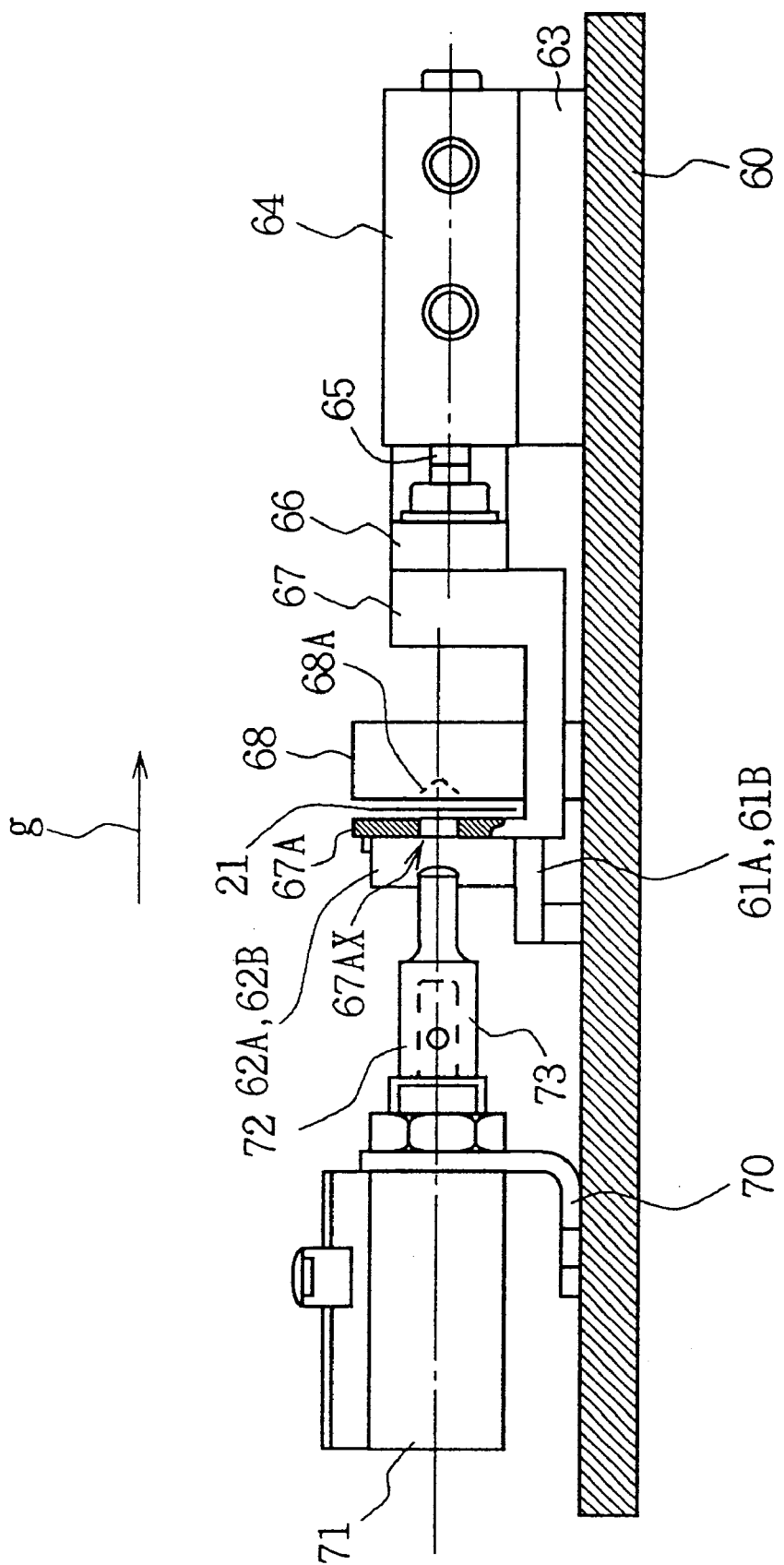
FIG. 10 is a side view showing the structure of the cover tape working part.

Practically, as shown in FIGS. 9 and 10, the cover tape working part 44 has a pair of rollers 62A and 62B which are supported at the both ends of the center of a base 60 in the width direction freely rotatably by supporting members 61A and 61B respectively. The cover tape 21 pulled out from the cover tape reel 43 can be guided by these rollers 62A and 62B so as to run in the specified state.

On one end of the base 60 in the longitudinal direction, a pressing cylinder 64 is fixed in parallel to the longitudinal direction of the base 60 via a fixing member 63, and a U-shaped frame body part 67 is fixed to the tip of an output axis 65 via a mounting board 66.

Furthermore, a die 68 is disposed inside the frame body part 67 in the state where it is fixed on the base 60 opposite to the front wall 67A of the frame body part 67 via a gap. Thus, when the pressing cylinder 64 is driven and the frame body part 67 is moved in the direction of an arrow (g), the cover tape 21 can be fixedly held as pinching with the front wall 67A and the die 68 of the frame body part 67.

On the other hand, on the other end of the base 60, a punching cylinder 71 is disposed in parallel to the base 60 in the longitudinal direction and in the state where it is fixed on the above base 60 by a fixing member 70.

Moreover, a punch 73 made of rigid material is attached to the tip of an output axis 72 of the punching cylinder 71. Thus, the punch 73 can be moved in the arrow-g direction by driving the punching cylinder 71.

Figure 11:
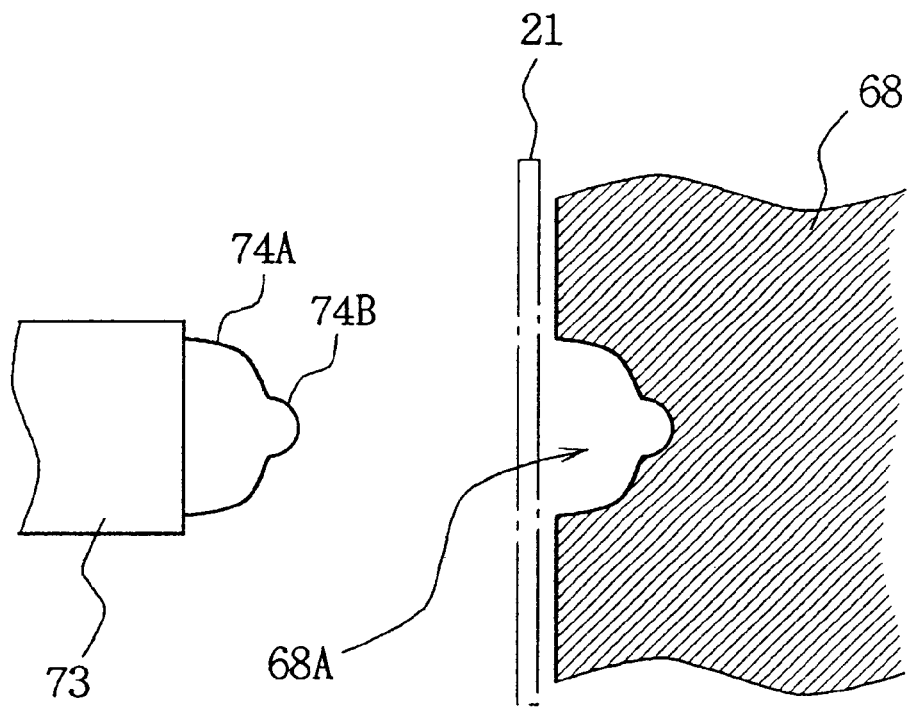
FIG. 11 is a side view illustrating the partial section of the structure of a punch and a die.

In this embodiment, as shown in FIG. 11, a first protruding part 74A being a part of a spherical shell is formed to protrude at the tip of the punch 73, and a second protruding part 74B being a part of a spherical body having a smaller diameter than the above first protruding part 74A is formed in one body at the tip of the above first protruding part 74A.

Besides, a hole 67AX (FIG. 10) which is able to pass the tip of the punch 73 is bored corresponding to that on the front wall 67A of the frame body part 67, and as shown in FIG. 11, a concaved part 68A having the same shape and being a size larger than the tip shape of the punch 73 is provided on the die 68 corresponding to the tip of the punch 73.

Therefore, in this cover tape working part 44, the pressing cylinder 64 is driven so that the cover tape 21 is pinched with the front wall 67A of the frame body part 67 and the die 68 under the control of the control part, and then the punching cylinder 71 is driven so that the tip of the punch 73 is strongly pushed in the concaved part 68A of the die 68 in one body with the cover tape 21. Thereby, the projecting part 12B as FIG. 5A can be formed on the cover tape 21.

In this connection, in the case of this tape-shaped parts package 10, a first screw inserting hole 60A is bored on the other end of the base 60, and a pair of second screw inserting holes 60BX and 60BY are bored near the center of the above base 60 in the longitudinal direction so as to pinch the punch 73. Thus, by strongly screwing the unit mounting board 40 via these first and second screw inserting holes 60A, 60BX and 60BY, the above cover tape working part 44 can be fixed to the unit mounting board 40.

In this embodiment, each of the second screw inserting holes 60BX and 60BY are formed into a circular-arc shape centering the first screw inserting hole 60A respectively. Thereby, this cover tape working part 44 can easily perform a fine adjustment in the shifting direction (an arrow (h)) centering the first screw inserting hole 60A.

(4) Operations and Effects

According to the above structure, while the carrier tape 11 pulled out from the carrier tape reel 26 of the parts packaging apparatus 20 is intermittently run by the tape running driving part 38 at the first pitch P1, the semiconductor tip 13 is sequentially stored in each embossed part 11A by the parts storing part. Besides, on the cover tape 21 pulled out from the cover tape reel 43, the projecting part 12B in the specified shape is sequentially formed at the predetermined position, in the cover tape working part 44. Then, thus obtained cover tape 12 is subjected to thermo compression bonding onto one side of the carrier tape 11 storing the semiconductor tip 13 in each embossed part 11A, by the seal unit part 52. This parts packaging apparatus packages the semiconductor tip 13 in this manner.

In the tape-shaped parts package 10 formed by such parts packaging apparatus 20, in normal state, the semiconductor tip 13 stored in each embossed part 11A of the carrier tape 11 is energized to the direction pushing into the corresponding embossed part 11A of the above carrier tape 11, when each projecting part 12B of the cover tape 12 is shriveling elastically. On the contrary, also when the carrier tape 11 has bent from this state and the cover tape 12 is bending accompanying with that, the projecting part 12B of the cover tape 12 extends corresponding to this and the above semiconductor tip 13 is energized to the direction pushing into the corresponding embossed part 11A of the carrier tape 11.

Accordingly, in this tape-shaped parts package 10, since each semiconductor tip 13 stored in each embossed part 11A of the carrier tape can be always energized to the direction pushing into the corresponding embossed part 11A by the corresponding projecting part 12B of the cover tape 12, even when the carrier tape 11 has bent and the cover tape 12 is bending accompanying with this, it can be prevented that the semiconductor tip 13 stored in each embossed part 11A of the carrier tape 11 projects from the above embossed part 11A.

Moreover, in this tape-shaped parts package 10, the stepped parts 11DA to 11DD are provided at the four corners of each embossed part 11A of the carrier tape 11 to be more extended than the other inner side faces by the prescribed lengths W1 and W2 respectively in the width direction and longitudinal direction of the carrier tape 11. The semiconductor tip 13 stored in the above embossed part 11A is held so that its four corners are supported by these stepped parts 11DA to 11DD.

Therefore, in this tape-shaped parts package 10, even when the corner of the semiconductor tip 13 is more projected outside than the other peripheral parts, it can be certainly prevented that the corner of the above semiconductor tip 13 contacts or sticks in the inner side faces of the embossed part 11A of the carrier tape 11.

According to the above structure, since the stepped parts 11DA to 11DD which are more extended than the other inner side faces by the specified lengths W1 and W2 respectively in the width direction and longitudinal direction of the above carrier tape 11 are provided at the four corners of each embossed part 11A of the carrier tape 11, and the semiconductor tip 13 stored in the above embossed part 11A is held by supporting the four corners by each of these stepped parts 11DA to 11DD, even when the corner of the semiconductor tip 13 stored in the embossed part 11A of the carrier tape 11 is more projected outside than the other peripheral parts, it can be certainly prevented that the corner of the above semiconductor tip 13 contacts or sticks in the inner side faces of the embossed part 11A. Therefore, semiconductor tips different in manufacture accuracy can be always stored in the specified state.

Furthermore, since the projecting parts 12B which are elastically flexible in the height direction are provided on the surface opposite to the carrier tape 11 of the cover tape 12 respectively corresponding to each embossed part 11A of the carrier tape 11, the semiconductor tip 13 stored in each embossed part 11A of the carrier tape 11 can always be energized to the direction pushing into the corresponding embossed part 11A. Therefore, it can be certainly prevented that the semiconductor tip 13 stored in each embossed part 11A of the carrier tape 11 is projected from the above embossed part 11A.

(5) Other Embodiments

In the aforementioned embodiment, it has dealt with the case where the present invention is applied to the tape-shaped parts package 10, carrier tape 11, cover tape 12 and parts packaging apparatus 20 for packaging the semiconductor tips 13. However, the present invention is not only limited to this but also it can be widely applied to other various tape-shaped parts packages, parts storing tapes, tape-shaped covers and parts packaging apparatuses for packaging electronic parts other than the semiconductor tip 13 or parts other than that.

Figure 12:
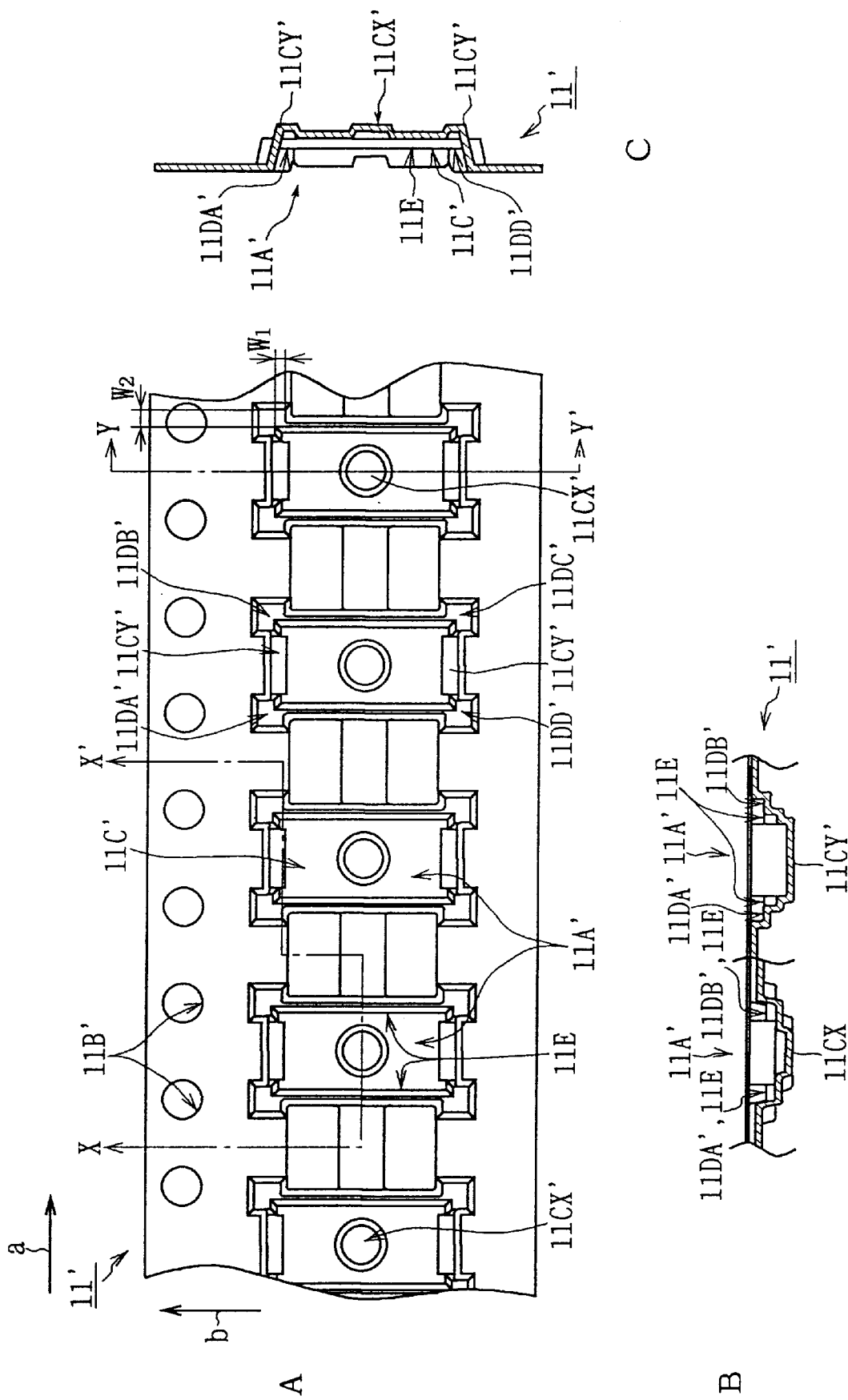
FIG. 12A is a plane view showing the structure of a carrier tape according to another embodiment.
FIG. 12B is an X–X' cross section of the carrier tape shown in FIG. 12A.
FIG. 12C is a Y–Y' cross section of the carrier tape shown in FIG. 12A.

In the aforementioned embodiment, it has dealt with the case where the stepped parts 11DA to 11DD are provided at each corner of each embossed part 11A of the carrier tape 11 respectively, and the semiconductor tip 13 stored in the embossed part 11A is held in the specified state by supporting it only by these stepped parts 11DA to 11DD. However, the present invention is not only limited to this. For example, as shown in FIGS. 12A to 12C in which the same reference numerals are added to corresponding parts of FIGS. 4A to 4C with "'", second stepped parts 11E having the same height as each of stepped parts 11DA' to 11DD' may be formed at the both ends of each of embossed parts 11A' in the width direction (arrow-a direction) so that the semiconductor tip 13 stored in an embossed part 11A' is held by supported by each stepped part 11DA' to 11DD' and each second stepped part 11E. Thereby, for example, also when the corner of the semiconductor tip 13 is more set back than the other peripheral parts, the above semiconductor tip 13 can be always held in the specified state by each of the stepped parts 11DA' to 11DD' and each of the second stepped parts 11E.

Figure 4:
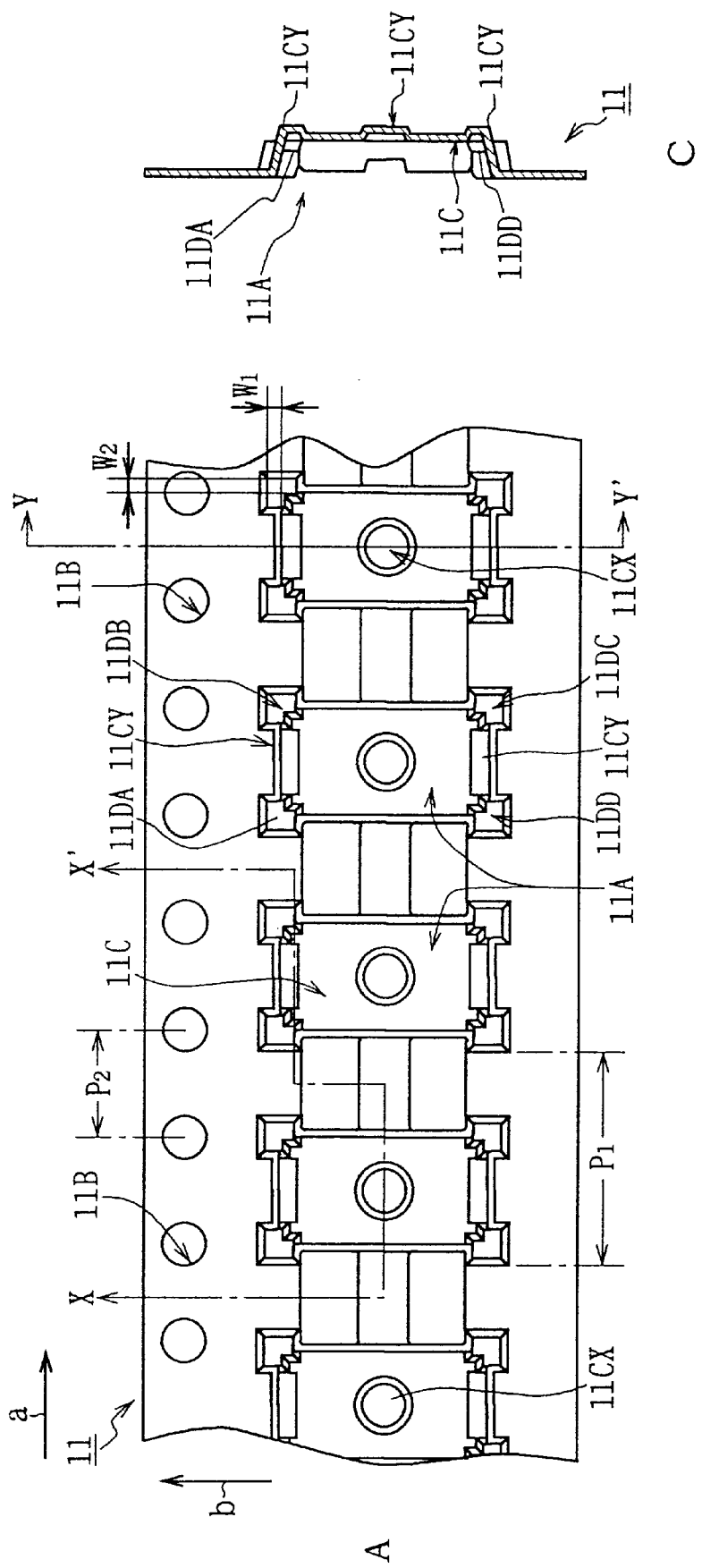
FIG. 4A is a plane view showing the structure of a carrier tape according to the present invention.
FIG. 4B is an X–X' cross section of the carrier tape shown in FIG. 4A.
FIG. 4C is a Y–Y' cross section of the carrier tape shown in FIG. 4A.

In the aforementioned embodiment, it has dealt with the case where, the stepped parts 11DA to 11DD having the specified height more-extended than the other inner side faces by the specified lengths W1 and W2 in the width direction and longitudinal direction of the above carrier tape 11, as shown in FIG. 4A, are provided at the four corners of each embossed part 11A of the carrier tape 11. However, the present invention is not only limited to this but also, provided that the above semiconductor tip 13 can be held without that any corners of the semiconductor tip contact or stick in the other inner side faces of the embossed part of the carrier tape, various shapes and sizes can be widely applied as the stepped parts.

In the aforementioned embodiment, it has dealt with the case where the shape of the projecting part 12B formed on the surface opposite to the carrier tape 11 of the cover tape 12 is constructed in a two-stepped spherical shell shape respectively corresponding to each embossed part 11A of the carrier tape 11, as shown in FIG. 5A. However, the present invention is not only limited to this but also that may be constructed in three- or more-stepped spherical shell shape or other shapes.

Figure 13:
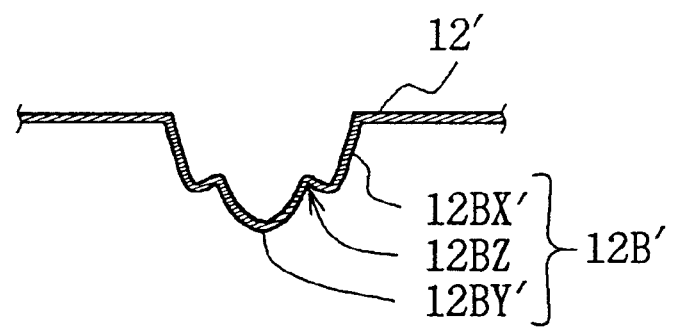
FIG. 13 is a cross section showing another embodiment of a cover tape.

Besides, the projecting part 12B of the carrier tape 12 may be constructed by forming a second projecting part 12BY' at the tip of a first projecting part 12BX' via a concaved part 12BZ that is concaved to the inside of the above first projecting part 12BX', as shown in FIG. 13. Thereby, the projecting part 12B' can be formed so that the projecting part 12B' can be expanded and contracted by weaker force.

Furthermore, as the structure of the projecting part 12B, other structures can be widely applied. Provided that shapes elastically flexible in the direction of the thickness of the cover tape 12, other various shapes can be widely applied as the projecting part to be formed on the cover tape 12.

In the aforementioned embodiment, it has dealt with the case of forming each projecting part 12B by deforming the cover tape 12. However, the present invention is not only limited to this but also the projecting part 12B may be formed by sticking an elastic material such as, e.g., sponge or expandable gasket (or other material elastically flexible in its height direction) on the surface opposite to the carrier tape 11 of the cover tape 12. Also in this manner, similar effects to the above embodiments can be obtained.

Moreover, in the aforementioned embodiment, it has dealt with the case of structuring the cover tape working part 44 as the projecting part forming means of the parts packaging apparatus 20 for forming the projecting part 12B on the cover tape 12 corresponding to each embossed part 11A of the carrier tape 11, as shown in FIGS. 9 and 10. However, the present invention is not only limited to this but also, provided that projecting parts flexible in the direction of the thickness of the above cover tape 12 can be formed on the cover tape, other various constructions can be applied as the construction of the cover tape working part 44.

Furthermore, in the aforementioned embodiment, it has dealt with the case where the seal unit part 52 as the sticking means for sticking the cover tape 12 with the projecting part 12B formed thereon on one side of the carrier tape 11 storing the semiconductor tips 13 in the embossed part 11A, is composed of the shaft 50, seal iron 51 and drive source 53. However, the present invention is not only limited to this but also various constructions can be applied.

INDUSTRIAL CAPABILITY

In a tape-shaped parts package, a parts storing tape, a tape-shaped cover and a parts packaging apparatus, the present invention is applicable to a tape-shaped parts package, parts storing tape, tape-shaped cover and parts packaging apparatus for packaging semiconductor tips or electronic parts other than semiconductor tips or parts other than electronic parts.

What is claimed is:

1. A parts storing tape in which a plurality of recessed parts are formed on one side thereof of a predetermined shape which generally correspond to a shape of a part stored therein with said recessed parts being defined by inner side faces thereof which extend in predetermined width and longitudinal directions of the parts storing tape, said parts storing tape comprising:

substantially L-shaped portions formed of a plurality of stepped sections of a specified height being located at each corner of said recessed part and being extended to a greater extent than the inner side faces of said recessed parts in the width and longitudinal directions of said parts storing tape.

2. The parts storing tape according to claim 1, wherein said plurality of stepped sections of said substantially L-shaped-portions include first stepped parts of the specified height and second stepped parts which are of the said same specified height as said first stepped parts with each of said first and second stepped parts being provided at each corner of the recessed parts.

3. The parts storing tape according to claim 1, wherein:
   each said recessed part includes a bottom face having a center portion, and
   a first damage-proof recessed part is formed at the center portion of the bottom face of said recessed part which extends below said bottom face.

4. The parts storing tape according to claim 1, wherein;
   second damage-proof recessed parts are formed at both ends of the bottom face of said recessed part in the longitudinal direction which extends below said bottom face.

* * * * *